(12) United States Patent
Fukui et al.

(10) Patent No.: US 12,188,788 B2
(45) Date of Patent: Jan. 7, 2025

(54) MAGNETIC SENSOR INCLUDING A MAGNETOSENSITIVE ELEMENT

(71) Applicant: TDK Corporation, Tokyo (JP)

(72) Inventors: Takato Fukui, Tokyo (JP); Takeo Gokita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 158 days.

(21) Appl. No.: 17/966,066

(22) Filed: Oct. 14, 2022

(65) Prior Publication Data

US 2023/0118914 A1 Apr. 20, 2023

(30) Foreign Application Priority Data

Oct. 18, 2021 (JP) .................... 2021-170294

(51) Int. Cl.
  *G01R 33/385* (2006.01)
  *G01D 5/14* (2006.01)
(52) U.S. Cl.
  CPC .................... *G01D 5/145* (2013.01)
(58) Field of Classification Search
  CPC .................................................... G01D 5/145
  See application file for complete search history.

(56) References Cited

U.S. PATENT DOCUMENTS

| | | | |
|---|---|---|---|
| 9,618,541 B1* | 4/2017 | Nguyen | G01R 15/183 |
| 2014/0218018 A1* | 8/2014 | Ivanov | G01R 33/02 |
| | | | 324/252 |
| 2016/0313374 A1* | 10/2016 | Morimoto | G01R 15/185 |
| 2021/0141033 A1 | 5/2021 | Solignac et al. | |
| 2022/0077756 A1* | 3/2022 | Hata | H01F 27/263 |

FOREIGN PATENT DOCUMENTS

JP   2020-522696 A   7/2020

OTHER PUBLICATIONS

Extended European Search Report issued in corresponding European Patent Application No. 22201889.7-1212, dated Mar. 9, 2023.

* cited by examiner

*Primary Examiner* — Alesa Allgood
(74) *Attorney, Agent, or Firm* — Rimon P.C.

(57) ABSTRACT

Disclosed herein is a magnetic sensor that includes first and second magnetic structures each having an annular structure and arranged in a first direction with a magnetic gap interposed therebetween, a magnetosensitive element disposed on a magnetic path formed by the magnetic gap and has a sensitivity axis in the first direction, a first excitation coil wound around the first magnetic structure, and a second excitation coil wound around the second magnetic structure.

20 Claims, 9 Drawing Sheets

MAGNETIC SENSOR INCLUDING A MAGNETOSENSITIVE ELEMENT

CROSS-REFERENCE TO RELATED APPLICATIONS

The disclosure of Japanese Patent Application No. 2021-170294 filed on Oct. 18, 2021 including the specification, drawings and abstract is incorporated herein by reference in its entirety.

BACKGROUND OF THE INVENTION

Field of the Invention

The present invention relates to a magnetic sensor and, more particularly, to a magnetic sensor capable of detecting a magnetic field in a low frequency region with high sensitivity.

Description of Related Art

Magnetic sensors using a magnetosensitive element are now used in various fields. To detect an extremely weak magnetic field, a magnetic sensor with a high S/N ratio is required. As a factor that decreases the S/N ratio of a magnetic sensor, 1/f noise is known. The 1/f noise becomes more conspicuous as the frequency component of a magnetic field to be measured is lower, so that it is necessary to reduce the 1/f noise in order to detect a magnetic field in a low frequency region of, e.g., 1 kHz or less with high sensitivity.

As a magnetic sensor having reduced 1/f noise, one described in JP-T-2020-522696 is known. The magnetic sensor described in JP-T-2020-522696 reduces the 1/f noise by modulating an operating point of a magnetosensitive element using a modulating unit.

However, the magnetic sensor described in JP-T-2020-522696 has a disadvantage that noise of the magnetosensitive element itself is also modulated.

SUMMARY

It is therefore an object of the present invention to provide a magnetic sensor improved so as to detect a magnetic field in a low frequency region with high sensitivity.

A magnetic sensor according to the present invention includes: first and second magnetic structures each having an annular structure and arranged in a first direction with a magnetic gap interposed therebetween; a magnetosensitive element disposed on a magnetic path formed by the magnetic gap and has a sensitivity axis in the first direction; a first excitation coil wound around the first magnetic structure; and a second excitation coil wound around the second magnetic structure.

According to the present invention, the magnetism collecting performance of the first and second magnetic structures varies depending on current flowing in the first and second excitation coils. Thus, when current having a predetermined frequency is made to flow in the first and second excitation coils, a detection signal output from the magnetosensitive element is modulated by the predetermined frequency, thereby allowing a magnetic field in a low frequency region to be detected with high sensitivity.

In the present invention, the first and second magnetic structures may be disposed symmetrically with respect to a second direction perpendicular to the first direction. This makes a magnetic field to be applied to the first and second magnetic structures by the first and second excitation coils less likely to be applied to the magnetosensitive element, thereby allowing a weak magnetic field to be detected with high sensitivity.

The magnetic sensor according to the present invention may further include a modulation circuit that makes current having a predetermined frequency flow in the first and second excitation coils, and the modulation circuit may be configured to be able to adjust the amount of current flowing in at least one of the first and second excitation coils. This can make magnetic fields to be applied to the first and second magnetic structures respectively by the first and second excitation coils coincide accurately with each other.

In the present invention, the first and second magnetic structures may each be constituted by a combination of a plurality of magnetic structural pieces. This allows easy formation of the first and second magnetic structures and easy winding of the first and second excitation coils.

In the present invention, the magnetosensitive element may be a magnetoresistance effect element formed on a sensor chip. Thus, it is possible to provide a small-sized magnetic sensor with high sensitivity.

In the present invention, the sensor chip may further include a first magnetic layer overlapping the first magnetic structure and a second magnetic layer overlapping the second magnetic structure, and magnetic flux flowing between the first and second magnetic layers may be applied to the magnetoresistance effect element. This enhances the density of the magnetic flux applied to the magnetoresistance effect element, allowing a weak magnetic field to be detected with higher sensitivity.

In the present invention, the sensor chip may further include a compensation coil that applies a cancelling magnetic field to the magnetoresistance effect element. This allows so-called closed loop control without involving an increase in the number of components.

As described above, according to the present invention, there can be provided a magnetic sensor improved so as to detect a magnetic field in a low frequency region with high sensitivity.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
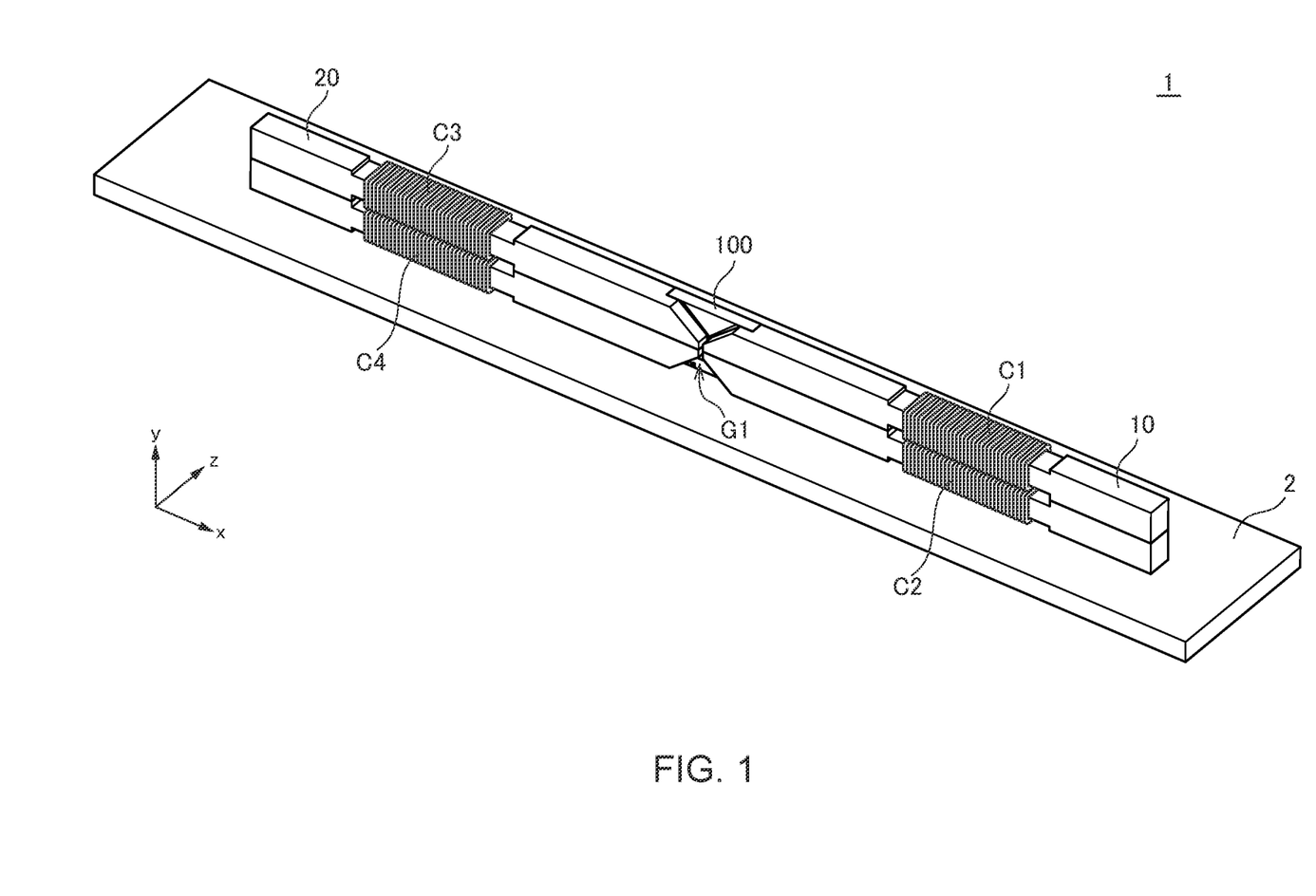
FIG. 1 is a schematic perspective view illustrating the outer appearance of a magnetic sensor 1 according to an embodiment of the present invention.
Figure 2:
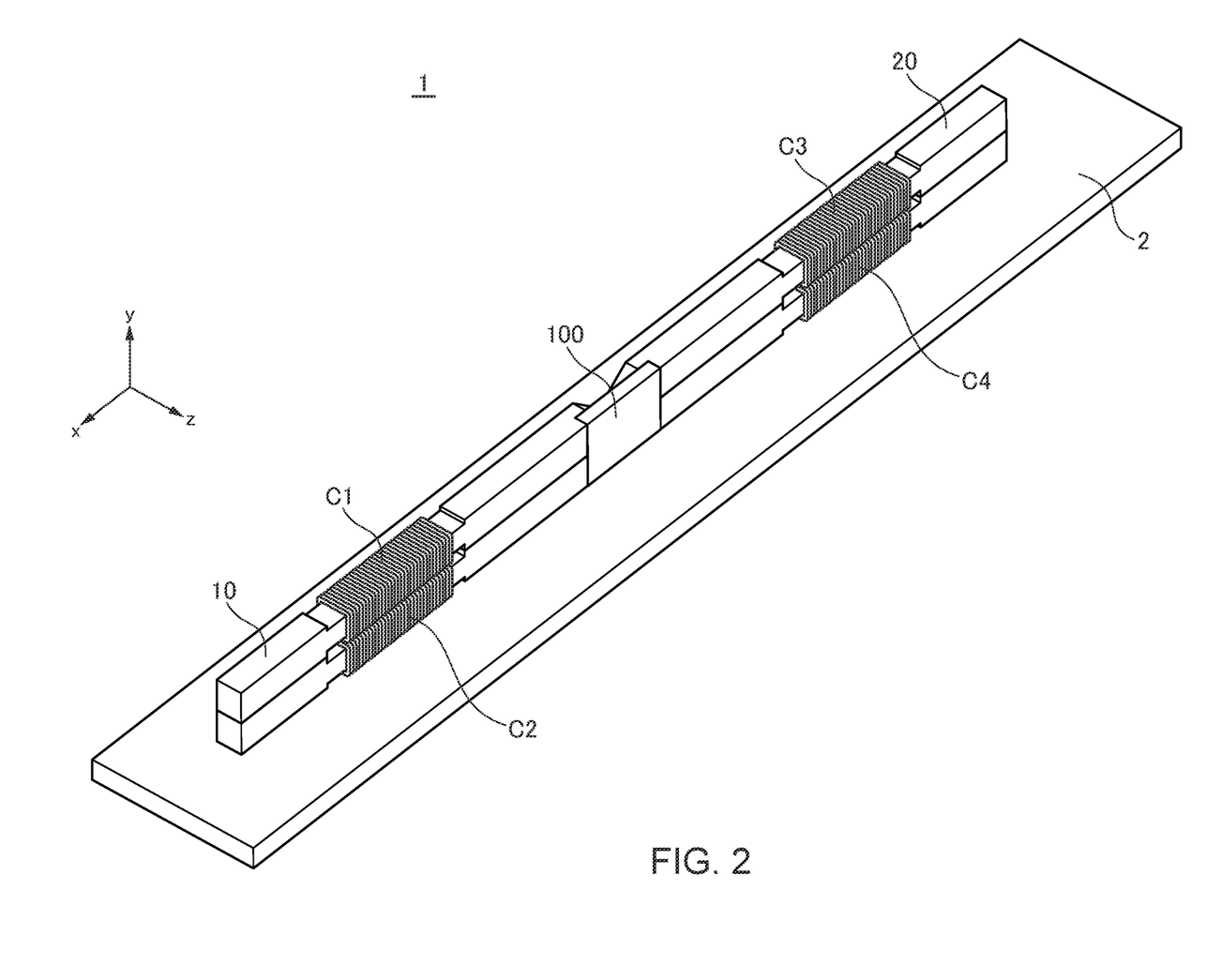
FIG. 2 is a schematic perspective view of the magnetic sensor 1 as viewed from another angle.
Figure 3:
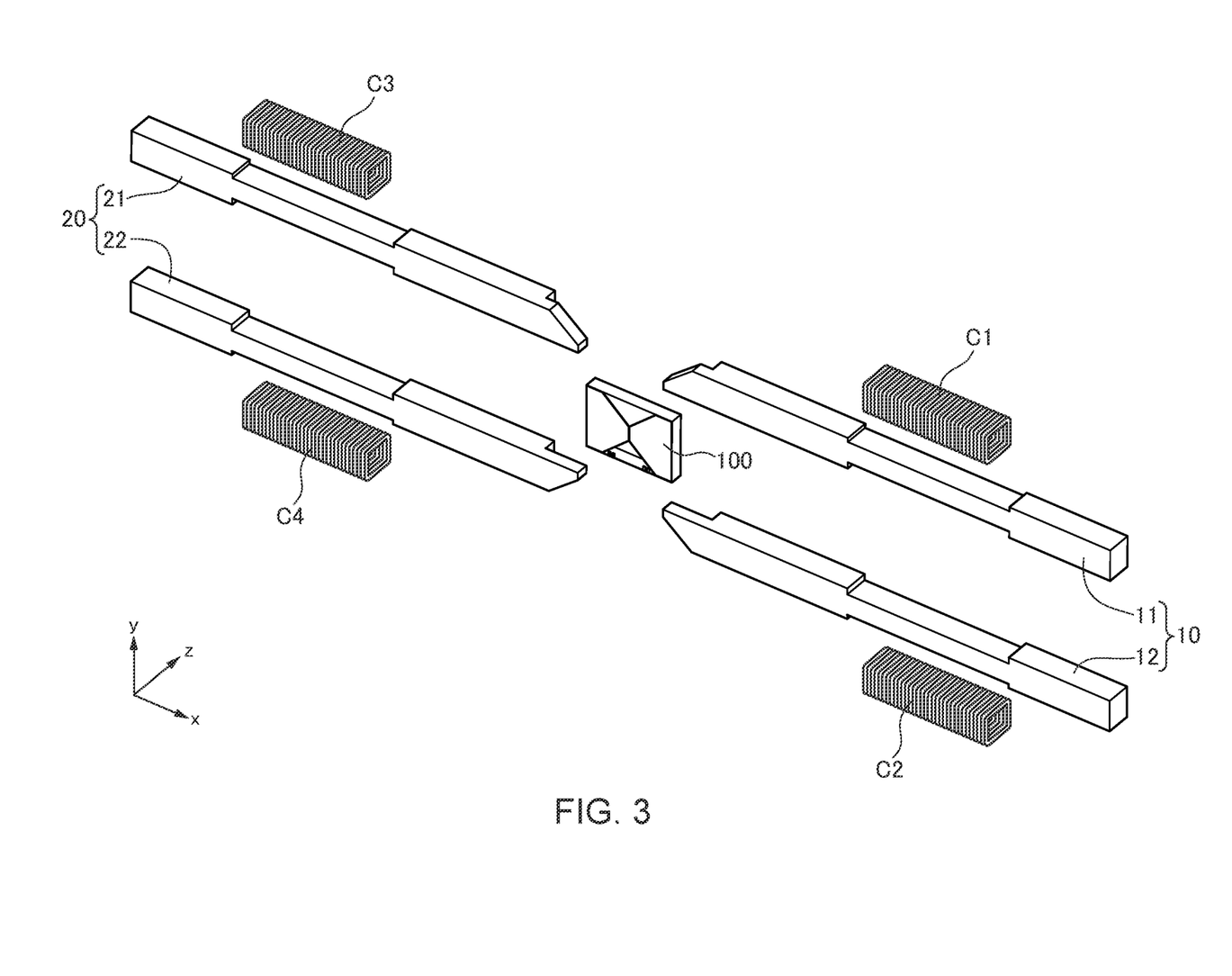
FIG. 3 is a schematic exploded perspective view of the magnetic sensor 1.

FIG. 1 is a schematic perspective view illustrating the outer appearance of a magnetic sensor 1 according to an embodiment of the present invention. FIG. 2 is a schematic perspective view of the magnetic sensor 1 as viewed from another angle. FIG. 3 is a schematic exploded perspective view of the magnetic sensor 1.

As illustrated in FIGS. 1 to 3, the magnetic sensor 1 according to the present embodiment includes a substrate 2, a sensor chip 100 mounted on the substrate 2, and magnetic structures 10 and 20 mounted on the substrate 2. Specifically, the sensor chip 100 and magnetic structures 10 and 20 are mounted on the main surface (xz plane) of the substrate 2.

The magnetic structures 10 and 20 are each a block having an annular structure made of a high permeability material such as ferrite. The magnetic structure 10 is constituted by a combination of two magnetic structural pieces 11 and 12, and the magnetic structure 20 is constituted by a combination of magnetic structural pieces 21 and 22. The magnetic structural pieces 11, 12, 21, and 22 each have a bar-like shape elongated in the x-direction. The widths of the respective magnetic structural pieces 11, 12, 21, and 22 in the y-direction are partly reduced, at which excitation coils C1 to C4 are wound, respectively. The magnetic structures 10 and 20 need not necessarily be constituted by a combination of a plurality of magnetic structural pieces; however, combining a plurality of magnetic structural pieces makes it possible to easily form an annular structure and easily wind the coils C1 to C4. The magnetic structures 10 and 20 have the same shape and are disposed symmetrically with respect to the z-direction.

Figure 4:
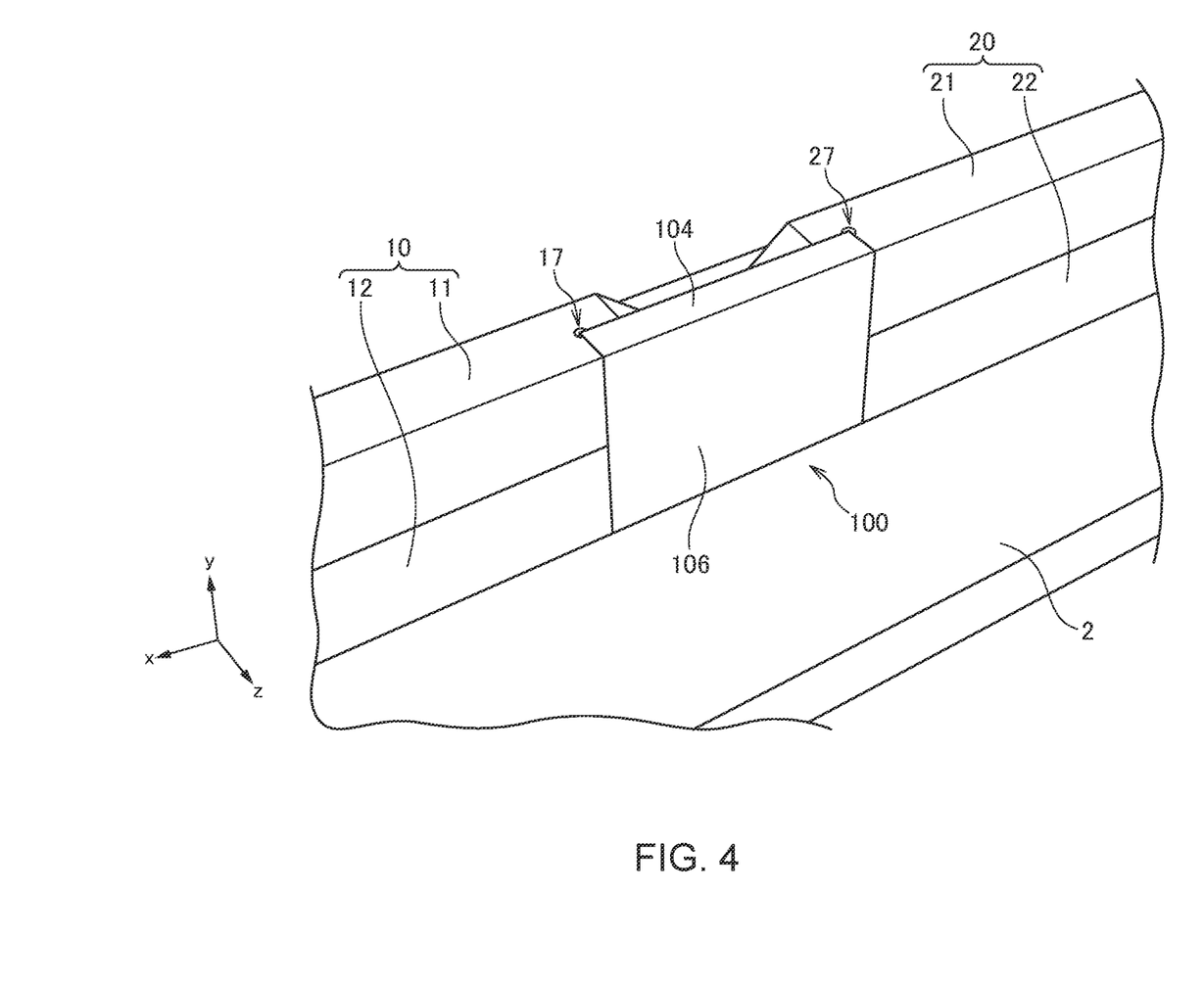
FIG. 4 is a schematic partial perspective view of the magnetic sensor 1.
Figure 5:
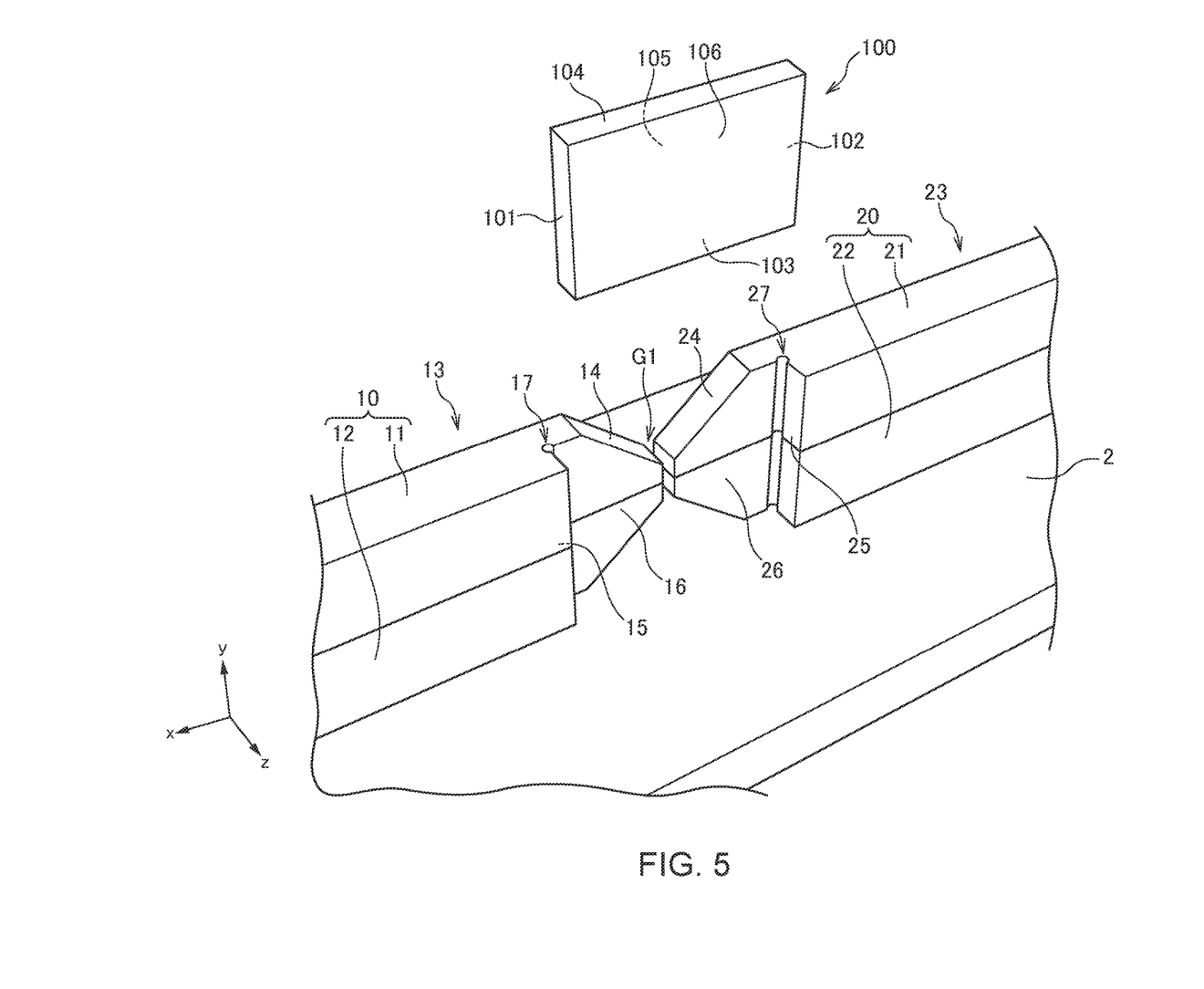
FIG. 5 is a schematic partial exploded perspective view of the magnetic sensor 1.

FIG. 4 is a schematic partial perspective view of the magnetic sensor 1, and FIG. 5 is a schematic partial exploded perspective view of the magnetic sensor 1.

As illustrated in FIG. 5, the magnetic structure 10 has a bar-like main body part 13 not overlapping the sensor chip 100 as viewed in the z-direction and a protruding part 14 overlapping the sensor chip 100 as viewed in the z-direction. Similarly, the magnetic structure 20 has a bar-like main body part 23 not overlapping the sensor chip 100 as viewed in the z-direction and a protruding part 24 overlapping the sensor chip 100 as viewed in the z-direction. The thickness of each of the protruding parts 14 and 24 in the z-direction is smaller than the thickness of each of the main body parts 13 and 23 in the z-direction. As a result, an inner surface 15 constituting the yz plane is formed at the end portion of the main body part 13 in the x-direction, and an inner surface 16 constituting the xy plane is formed in the protruding part 14. Similarly, an inner surface 25 constituting the yz plane is formed at the end portion of the main body part 23 in the x-direction, and an inner surface 26 constituting the xy plane is formed in the protruding part 24.

The sensor chip 100 has side surfaces 101 and 102 constituting the yz plane and positioned on the opposite sides, side surfaces 103 and 104 constituting the xz plane and positioned on the opposite sides, and an element formation surface 105 and a back surface 106 constituting the xy plane and positioned on the opposite sides. The sensor chip 100 is mounted so as to stand on the substrate 2 such that the side surface 103 faces the main surface of the substrate 2. Further, as illustrated in FIG. 4, the sensor chip 100 and the magnetic structures 10 and 20 are positioned on the substrate 2 such that the side surfaces 101 and 102 of the sensor chip 100 are covered respectively with the inner surfaces 15 and 25 of the respective magnetic structure 10 and 20. That is, the positional relation in the x-direction between the sensor chip 100 and the magnetic structure 10 is fixed by making the side surface 101 of the sensor chip 100 abut against the inner surface 15 of the magnetic structure 10, and the positional relation in the x-direction between the sensor chip 100 and the magnetic structure 20 is fixed by making the side surface 102 of the sensor chip 100 abut against the inner surface 25 of the magnetic structure 20. As a result, the length of a magnetic gap G1 formed between the protruding parts 14 and 24 in the x-direction is fixed. Further, when the sensor chip 100 and magnetic structures 10 and 20 are positioned in the x-direction, the element formation surface 105 of the sensor chip 100 is covered with the inner surfaces 16 and 26 of the respective magnetic structures 10 and 20.

A groove 17 is formed at the corner portion between the inner surfaces 15 and 16 of the magnetic structure 10. Similarly, a groove 27 is formed at the corner portion between the inner surfaces 25 and 26 of the magnetic structure 20. That is, when the corner portion is rounded due to processing accuracy of the like, the rounded corner portion and the sensor chip 100 interfere with each other to hinder proper positioning of the sensor chip 100. To cope with such a problem, the corner portions are removed by forming the grooves 17 and 27.

Figure 6:
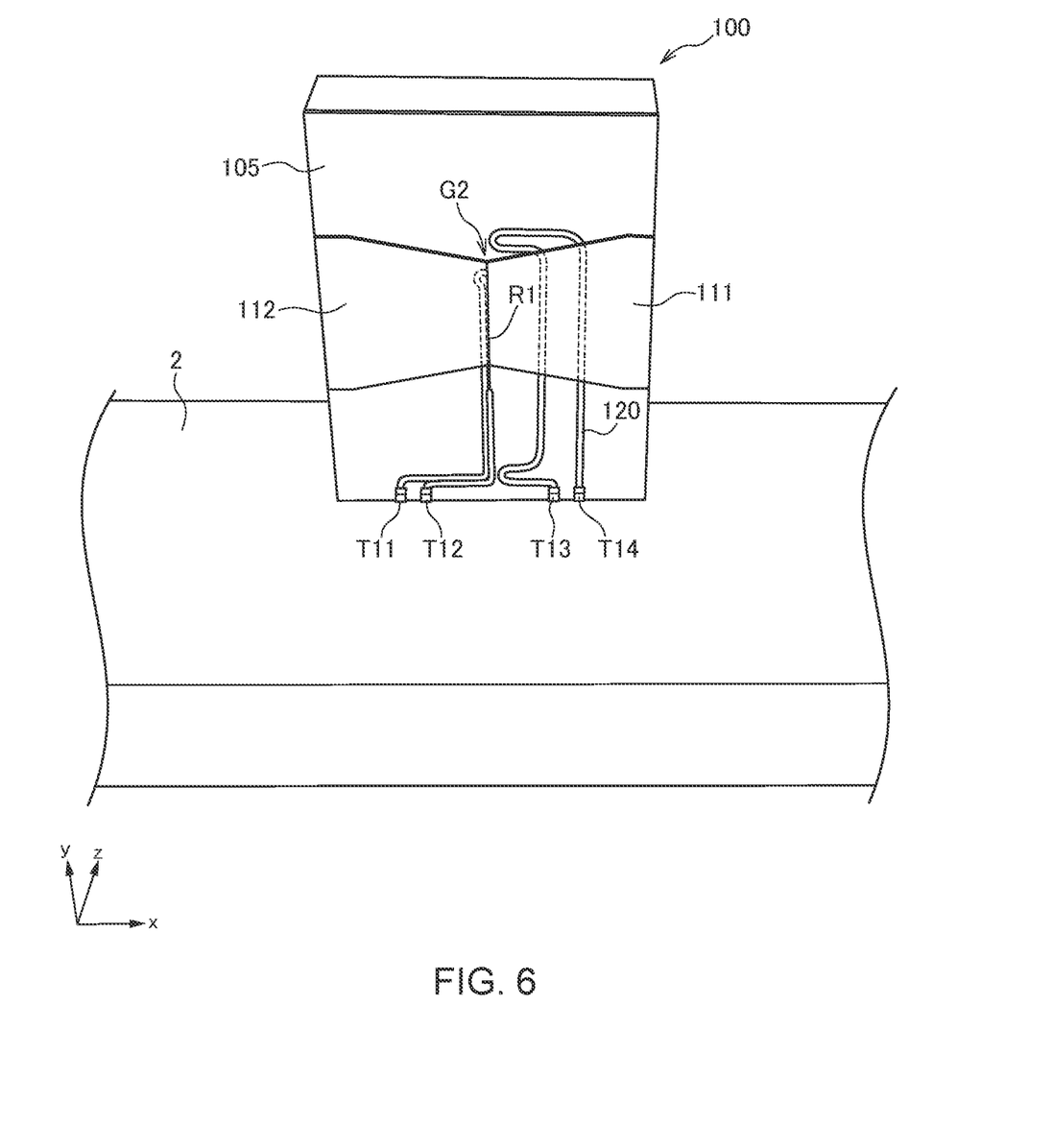
FIG. 6 is a schematic perspective view for explaining the structure of the sensor chip 100.

FIG. 6 is a schematic perspective view for explaining the structure of the sensor chip 100.

As illustrated in FIG. 6, a magnetosensitive element R1, magnetic layers 111 and 112, and terminal electrodes T11 to T14 are formed on the element formation surface 105 of the sensor chip 100. The magnetic layers 111 and 112 are each a thin film made of an NiFe-based material such as permalloy, and the magnetosensitive element R1 is disposed on a magnetic path formed by a magnetic gap G2 created between the magnetic layers 111 and 112. The magnetic layer 111 overlaps the protruding part 14 of the magnetic structure 10 in the z-direction, and the magnetic layer 112 overlaps the protruding part 24 of the magnetic structure 20 in the z-direction. As a result, magnetic flux in the x-direction flowing between the magnetic structures 10 and 20 is applied to the magnetosensitive element R1 through the magnetic layers 111 and 112.

Figure 7:
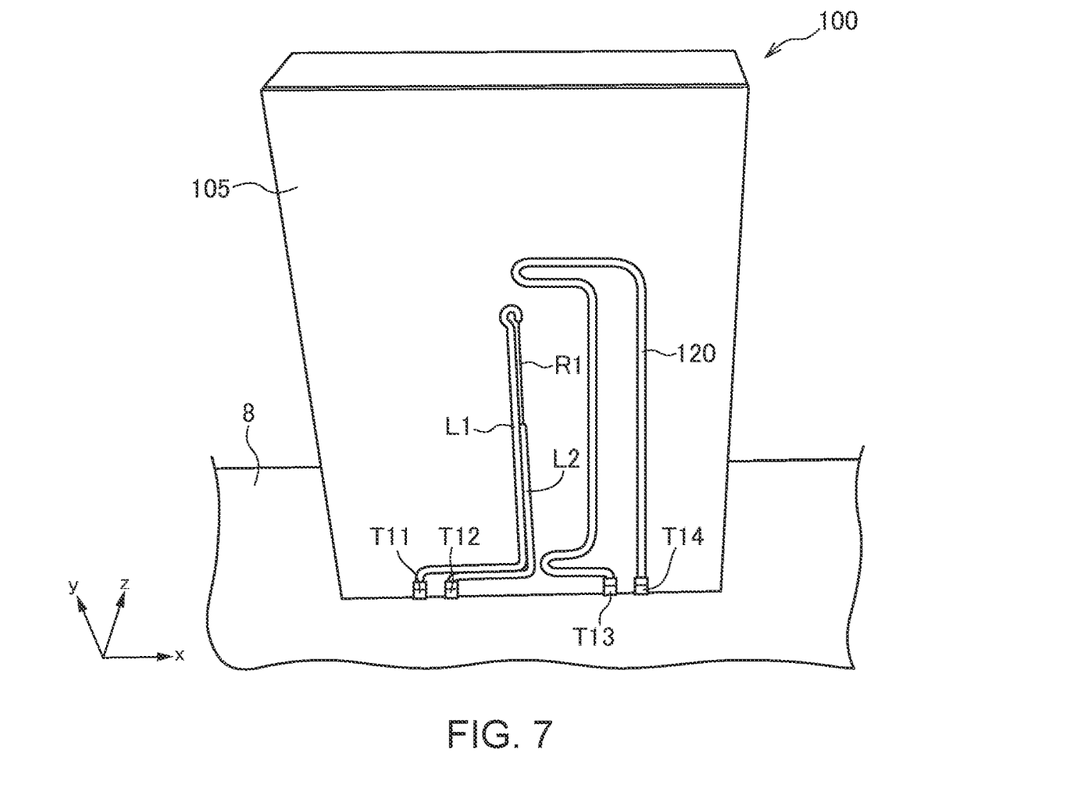
FIG. 7 is a schematic perspective view illustrating a state where the magnetic layers 111 and 112 are removed from the sensor chip 100.

FIG. 7 is a schematic perspective view illustrating a state where the magnetic layers 111 and 112 are removed from the sensor chip 100.

As illustrated in FIG. 7, the magnetosensitive element R1 extends in the y-direction on the element formation surface 105, and one end thereof is connected to the terminal electrode T11 through a wiring L1, and the other end thereof is connected to the terminal electrode T12 through a wiring L2. The magnetosensitive element R1 is a magnetoresistance effect element whose electric resistance varies depending on the direction of magnetic flux. The fixed magnetization direction (the direction of sensitivity axis) of the magnetosensitive element R1 is the x-direction. In the present invention, the magnetosensitive element R1 may not necessarily be a magnetoresistance effect element; however, using a magnetoresistance effect element as the magnetosensitive element R1 allows a weak magnetic field to be detected with high sensitivity. A compensation coil 120 is also formed in the upper or lower layer of the element formation surface 105. One end of the compensation coil 120 is connected to the terminal electrode T13, and the other end thereof is connected to the terminal electrode T14. The compensation coil 120 cancels a magnetic field to be applied to the magnetosensitive element R1 to allow so-called closed-loop control. In the present embodiment, since the sensor chip 100 is mounted so as to stand on the substrate 2 such that the side surface 103 faces the substrate 2, the wiring distance between the terminal electrodes T11 to T14 and the substrate 2 can be reduced. This allows land patterns provided on the substrate 2 and the terminal electrodes T11 to T14 to be directly connected to one another by using a solder.

Figure 8:
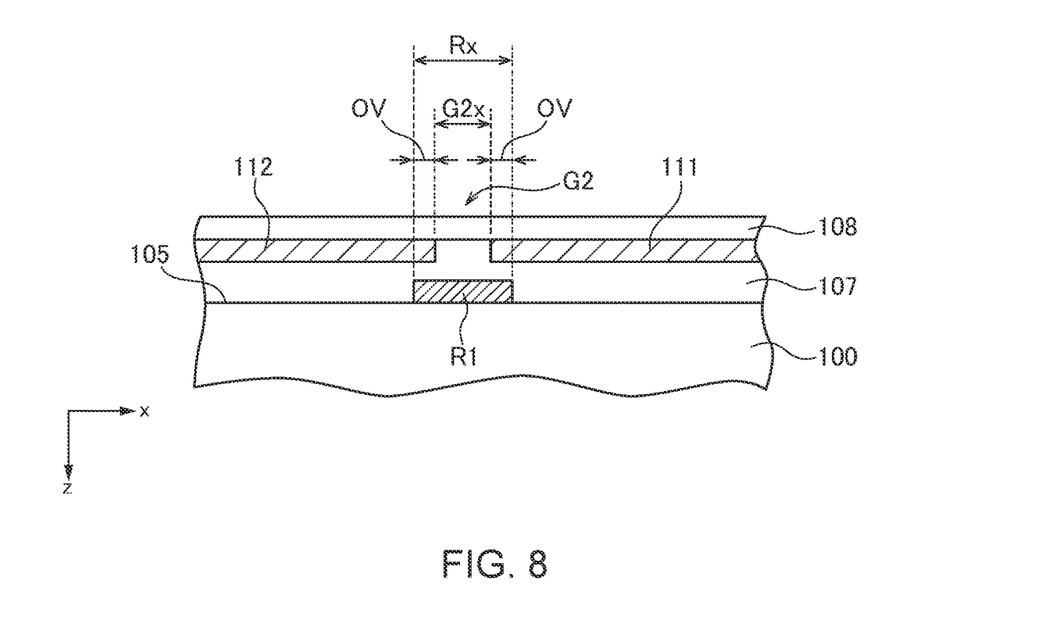
FIG. 8 is an xz cross-sectional view of the main part of the sensor chip 100.

FIG. 8 is an xz cross-sectional view of the main part of the sensor chip 100.

As illustrated in FIG. 8, the magnetosensitive element R1 is formed on the element formation surface 105 of the sensor chip 100. The magnetosensitive element R1 is covered with an insulating layer 107, and the magnetic layers 111 and 112 are formed on the surface of the insulating layer 107. The magnetosensitive element R1 is positioned between the magnetic layers 111 and 112 in a plan view (as viewed in the z-direction). Thus, a magnetic field passing through the magnetic gap G2 is applied to the magnetosensitive element R1. That is, the magnetosensitive element R1 is disposed in the vicinity of the magnetic gap G2 formed by the magnetic layers 111 and 112 and on a magnetic path where a magnetic field to be detected passing through the magnetic gap G2 can be detected. Thus, the magnetosensitive element R1 may not necessarily be disposed between the two magnetic layers 111 and 112 and may be disposed at any position as long as it is applied with at least a part of the magnetic field passing through the magnetic gap G2. There is no particular restriction on the relation between the width of the magnetic gap G2 and the width of the magnetosensitive element R1. In the example of FIG. 8, a width G2x of the magnetic gap G2 in the x-direction is smaller than a width Rx of the magnetosensitive element R1 in the x-direction, whereby the magnetic layers 111 and 112 each have an overlap OV with the magnetosensitive element R1 as viewed from the z-direction. To apply as much as possible the magnetic field that passes through the magnetic gap G2 to the magnetosensitive element R1, the distance between each of the magnetic layers 111, 112 and the magnetosensitive element R1 in the z-direction in the overlap OV is desirably as small as possible, and more desirably, the distance between each of the magnetic layers 111, 112 and the magnetosensitive element R1 in the z-direction is smaller than the width G2x of the magnetic gap G2 in the x-direction. With this configuration, the magnetosensitive element R1 serves as the main magnetic path for the magnetic field that passes the magnetic gap G2.

Figure 9:
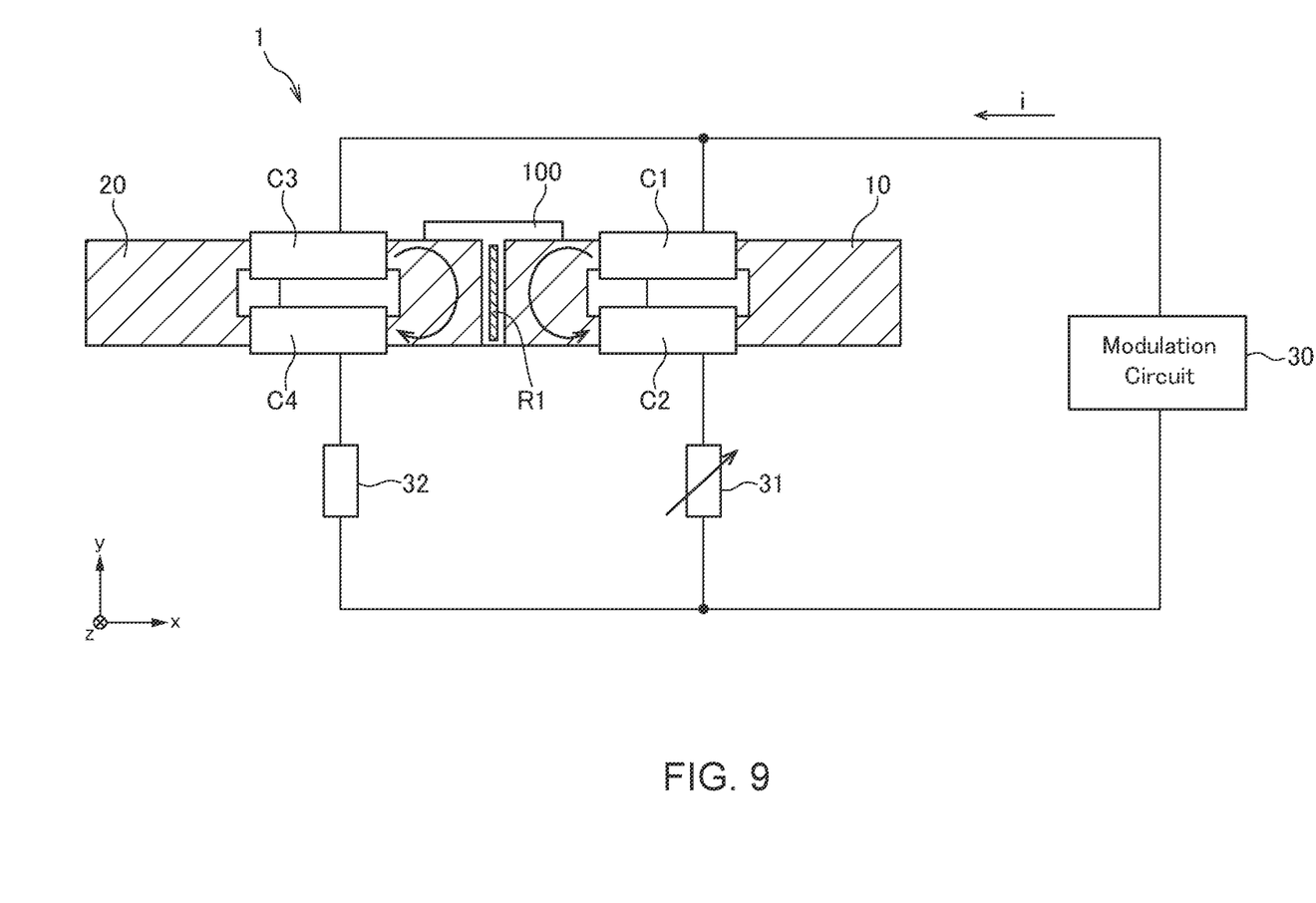
FIG. 9 is a schematic view for explaining a method for the use of the magnetic sensor 1.

FIG. 9 is a schematic view for explaining a method for the use of the magnetic sensor 1 according to the present embodiment.

As illustrated in FIG. 9, when using the magnetic sensor 1 according to the present embodiment, the excitation coils C1 to C4 are connected to a modulation circuit 30 to make alternating current i having a predetermined frequency to flow in the excitation coils C1 to C4. The winding direction and current flow direction of the excitation coils C1 to C4 are set such that the direction of magnetic flux made to flow in the magnetic structure 10 by the excitation coils C1 and C2 and the direction of magnetic flux made to flow in the magnetic structure 20 by the excitation coils C3 and C4 become opposite to each other. Thus, when magnetic flux on the magnetic structure 10 side is circulated counterclockwise (left-handed) by the excitation coils C1 and C2, magnetic flux on the magnetic structure 20 side is circulated clockwise (right-handed) by the excitation coils C3 and C4. Conversely, when magnetic flux on the magnetic structure 10 side is circulated clockwise (right handed) by the excitation coils C1 and C2, magnetic flux on the magnetic structure 20 side is circulated counterclockwise (left handed) by the excitation coils C3 and C4.

When the alternating current i is made to flow in the excitation coils C1 to C4 to excite the magnetic structures 10 and 20, the magnetic structures 10 and 20 are magnetically saturated, and the permeability thereof significantly decreases. Therefore, the magnetic structures 10 and 20 lose their magnetism collecting power, with the result that a weak magnetic field to be detected is no longer applied to the magnetosensitive element R1. In addition, the circulation direction of magnetic flux in the magnetic structure 10 and the circulation direction of magnetic flux in the magnetic structure 20 are opposite to each other, so that, in the magnetic gap G1 in which the magnetosensitive element R1 is disposed, magnetic flux in the x-direction flowing in the magnetic structure 10 and the magnetic flux in the x-direction flowing in the magnetic structure 20 cancel each other. This prevents magnetic flux in the x-direction made to flow in the magnetic structures 10 and 20 by the excitation coils C1 to C4 from being applied to the magnetosensitive element R1. In particular, the magnetic structures 10 and 20 are disposed symmetrically with respect to the z-direction in the present embodiment, so that magnetic flux in the x-direction flowing in the magnetic structure 10 and magnetic flux in the x-direction flowing in the magnetic structure 20 cancel each other more accurately in the magnetic gap G1.

On the other hand, at the timing when current flowing in the excitation coils C1 to C4 becomes zero, the magnetic structures 10 and 20 are not excited, so that high permeability can be obtained. Thus, a weak magnetic field to be detected is collected by the magnetic structures 10 and 20, and thus a magnetic field in the x-direction passing through the magnetic gap G1 is applied to the magnetosensitive element R1. As a result, a detection signal obtained from the magnetosensitive element R1 is modulated by the frequency of the alternating current i, so that 1/f noise significantly decreases. Further, feedback current according to the detection signal obtained from the magnetosensitive element R1 flows in the compensation coil 120, and the magnetic field applied to the magnetosensitive element R1 is maintained at zero by a cancelling magnetic field generated by the feedback current. Such closed loop control allows high detection accuracy to be achieved.

There is no particular restriction on the connection relation between the modulation circuit 30 and the excitation coils C1 to C4. In the example illustrated in FIG. 9, a series circuit of the excitation coils C1, C2 and a series circuit of the excitation coils C3, C4 are connected in parallel. As a result, the same current flows in the excitation coils C1 and C2, and the same current flows in the excitation coils C3 and C4. Further, a variable resistor 31 is connected in series to the excitation coils C1 and C2, and a fixed resistor 32 is connected in series to the excitation coils C3 and C4. The variable resistor 31 is a device for adjusting the amount of the alternating current flowing in the excitation coils C1 and C2, and the resistance value of the variable resistor 31 can be adjusted so as to prevent a magnetic field generated by the excitation coils C1 to C4 from being applied to the magnetosensitive element R1. The fixed resistor 32 connected to the excitation coils C3 and C4 may be replaced with a variable resistor. Further, all the excitation coils C1 to C4 may be connected in series. Furthermore, the modulation circuit 30 may be configured so as to independently control the alternating current flowing in the excitation coils C1 and C2 and the alternating current flowing in the excitation coils C3 and C4.

As described above, the magnetic sensor 1 according to the present embodiment has the pair of magnetic structures 10 and 20 that collect a weak magnetic field to be detected on the magnetosensitive element R1, and the excitation coils C1 and C2 are wound around the annularly structured magnetic structure 10, and the excitation coils C3 and C4 are wound around the annularly structured magnetic structure 20. Thus, by making the alternating current i flow in the excitation coils C1 to C4, it is possible to modulate a detection signal obtained from the magnetosensitive element R1. As a result, even when the frequency of a weak magnetic field to be detected is low, 1/f noise can be significantly reduced. In addition, magnetic fields in the x-direction generated by the excitation coils C1 to C4 are canceled on the magnetosensitive element R1, preventing noise of the magnetosensitive element R1 itself from being modulated. Further, the magnetic structures 10 and 20 each have an annular closed magnetic loop structure, thereby reducing the amount of current required to saturate the magnetic structures 10 and 20. Furthermore, a magnetoresistance effect element is used as the magnetosensitive element R1, so that it is possible to improve magnetic detection efficiency per unit area as compared to when a coil is used to detect a magnetic field.

While the preferred embodiment of the present invention has been described, the present invention is not limited to the above embodiment, and various modifications may be made within the scope of the present invention, and all such modifications are included in the present invention.

Figure 10A:
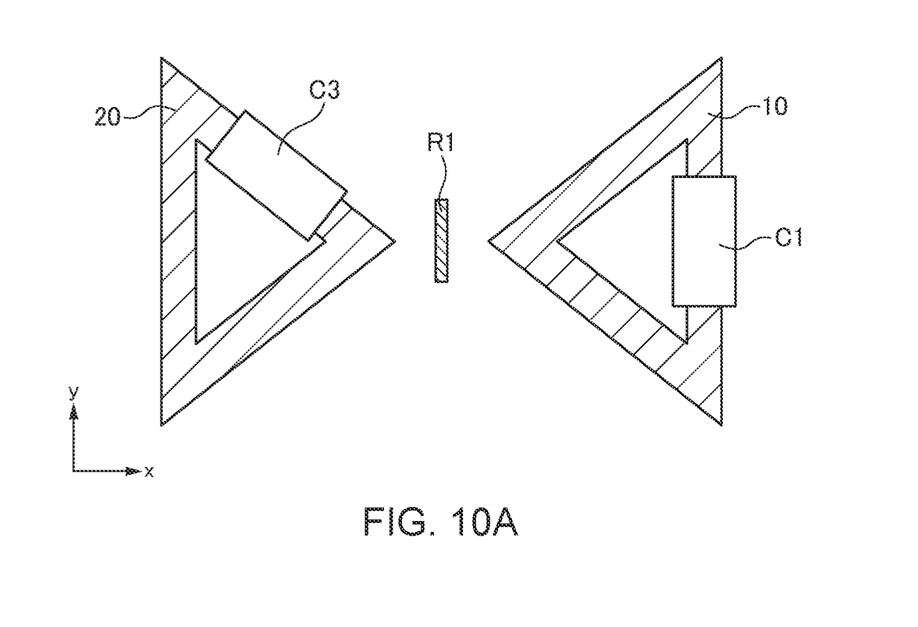
FIG. 10A is a schematic diagram for explaining a shape of magnetic structures 10 and 20 according to a first modification.
Figure 10B:
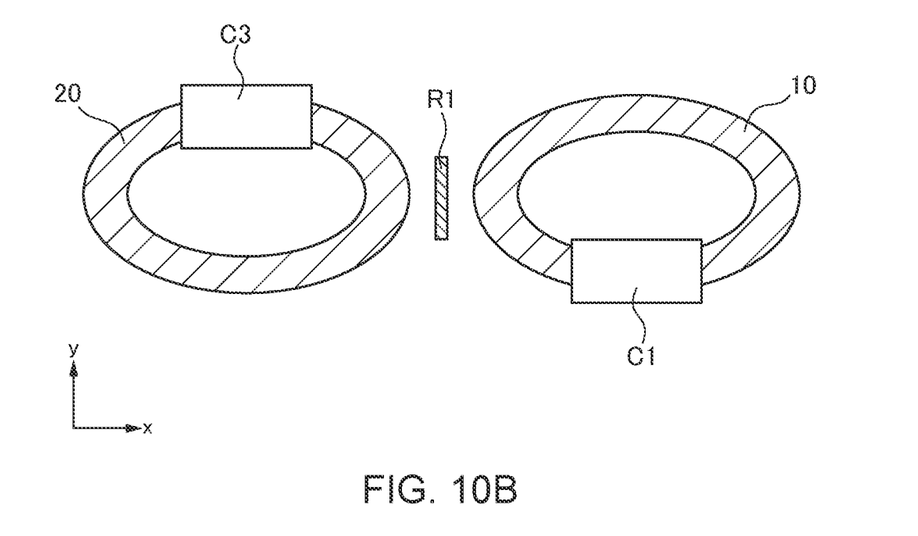
FIG. 10B is a schematic diagram for explaining a shape of magnetic structures 10 and 20 according to a second modification.

For example, although alternating current is made to flow in the excitation coils C1 to C4 in the above embodiment, pulsed direct current may be made to intermittently flow in the excitation coils C1 to C4 in place of the alternating current. Further, in the above embodiment, the magnetic structures 10 and 20 have a rectangular annular shape; however, the magnetic structures 10 and 20 are not particularly limited in shape as long as they have an annular structure and may have a triangular annular shape as illustrated in FIG. 10A or a circular or elliptical annular shape as illustrated in FIG. 10B. Further, although the two excitation coils C1 and C2 are wound around the magnetic structure 10, and the two excitation coils C3 and C4 are wound around the magnetic structure 20, one (C2, C4) of the two coils may be omitted.

What is claimed is:

1. A magnetic sensor comprising:
    first and second magnetic structures each having an annular structure and arranged in a first direction with a magnetic gap interposed therebetween;
    a magnetosensitive element disposed on a magnetic path formed by the magnetic gap and has a sensitivity axis in the first direction;
    a first excitation coil wound around the first magnetic structure; and
    a second excitation coil wound around the second magnetic structure,
    wherein the first magnetic structure has a first aperture that penetrates the first magnetic structure in a second direction perpendicular to the first direction,
    wherein the second magnetic structure has a second aperture that penetrates the second magnetic structure in the second direction, and
    wherein the first and second apertures do not overlap each other in the second direction.

2. The magnetic sensor as claimed in claim 1, wherein the first and second magnetic structures are disposed symmetrically with respect to a plane perpendicular to the first direction.

3. The magnetic sensor as claimed in claim 1, wherein the first and second magnetic structures do not overlap each other in the second direction.

4. The magnetic sensor as claimed in claim 1, further comprising a modulation circuit that makes current having a predetermined frequency flow in the first and second excitation coils,
    wherein the modulation circuit is configured to be able to adjust an amount of current flowing in at least one of the first and second excitation coils.

5. The magnetic sensor as claimed in claim 4, wherein the first and second excitation coils are connected in parallel such that a sum of current flowing through the first and second excitation coils is a same as the current supplied from the modulation circuit.

6. The magnetic sensor as claimed in claim 1, wherein each of the first and second magnetic structures is constituted by a combination of a plurality of magnetic structural pieces.

7. The magnetic sensor as claimed in claim 6, wherein each of the plurality of magnetic structural pieces has a bar-like shape elongated in the first direction.

8. The magnetic sensor as claimed in claim 6,
    wherein the first magnetic structure includes first and second magnetic structural pieces each having a bar-like shape elongated in the first direction,
    wherein the second magnetic structure include third and fourth magnetic structural pieces each having a bar-like shape elongated in the first direction,
    wherein each of the first, second, third, and fourth magnetic structural pieces has a first section, a second section, and a third section located between the first and second sections in the first direction and narrower in width than the first and second sections,
    wherein the first magnetic structure has a structure in which the first section of the first magnetic structural piece and the first section of the second magnetic structural piece are connected to each other and the second section of the first magnetic structural piece and the second section of the second magnetic structural piece are connected to each other,
    wherein the second magnetic structure has a structure in which the first section of the third magnetic structural piece and the first section of the fourth magnetic structural piece are connected to each other and the second section of the third magnetic structural piece and the second section of the fourth magnetic structural piece are connected to each other,
    wherein at least a part of the first excitation coil is wound around the third section of one of the first and second magnetic structural pieces, and wherein at least a part of the second excitation coil is wound around the third section of one of the third and fourth magnetic structural pieces.

9. The magnetic sensor as claimed in claim 8,
wherein a remaining part of the first excitation coil is wound around the third section of another of the first and second magnetic structural pieces, and
wherein a remaining part of the second excitation coil is wound around the third section of another of the third and fourth magnetic structural pieces.

10. The magnetic sensor as claimed in claim 8,
wherein the first and second structural pieces are stacked in a third direction perpendicular to the first and second directions, and
wherein the third and fourth structural pieces are stacked in the third direction.

11. The magnetic sensor as claimed in claim 10, further comprising a substrate,
wherein the magnetosensitive element is integrated on a sensor chip mounted on the substrate,
wherein the second magnetic structural piece is mounted on the substrate such that the second magnetic structural piece is arranged between the substrate and the first magnetic structural piece in the third direction, and
wherein the fourth magnetic structural piece is mounted on the substrate such that the fourth magnetic structural piece is arranged between the substrate and the third magnetic structural piece in the third direction.

12. The magnetic sensor as claimed in claim 1, wherein the magnetosensitive element is a magnetoresistance effect element formed on a sensor chip.

13. The magnetic sensor as claimed in claim 12,
wherein the sensor chip further includes a first magnetic layer overlapping the first magnetic structure in the second direction and a second magnetic layer overlapping the second magnetic structure in the second direction, and
wherein magnetic flux flowing between the first and second magnetic layers is applied to the magnetoresistance effect element.

14. The magnetic sensor as claimed in claim 12, wherein the sensor chip further includes a compensation coil that applies a cancelling magnetic field to the magnetoresistance effect element.

15. A magnetic sensor comprising: a substrate; first and second magnetic structures each having an annular structure mounted on the substrate such that the first and second magnetic structures are arranged in a first direction on the substrate; a first coil wound around the first magnetic structure such that the first coil passes through a first aperture that penetrates the first magnetic structure in a second direction perpendicular to the first direction; a second coil wound around the second magnetic structure such that the second coil passes through a second aperture that penetrates the second magnetic structure in the second direction; and a sensor chip mounted on the substrate and having a magnetosensitive element, wherein a part of the sensor chip overlaps with a part of the first magnetic structure when viewed from the second direction, and wherein another part of the sensor chip overlaps with a part of the second magnetic structure when viewed from the second direction.

16. The magnetic sensor as claimed in claim 15, wherein the magnetosensitive element is located between the part of the first magnetic structure and the part of the second magnetic structure when viewed from the second direction.

17. The magnetic sensor as claimed in claim 15, wherein the first and second coils are connected in parallel.

18. A magnetic sensor comprising:
a substrate;
first and second magnetic structural pieces mounted on the substrate such that the first and second magnetic structural pieces are arranged in a first direction on the substrate;
third and fourth magnetic structural pieces stacked on the first and second magnetic structural pieces, respectively;
a sensor chip mounted on the substrate and having a magnetosensitive element such that a part of the sensor chip overlaps with a part of at least one of the first and third magnetic structural pieces when viewed from a second direction perpendicular to the first direction and that another part of the sensor chip overlaps with a part of at least one of the second and fourth magnetic structural pieces when viewed from the second direction; and
first, second, third, and fourth coils,
wherein each of the first, second, third, and fourth magnetic structural pieces has a first section, a second section, and the third section located between the first and second sections in the first direction and narrower in width than the first and second sections,
wherein the third magnetic structural piece is stacked on the first magnetic structural piece in a third direction perpendicular to the first and second directions such that the first section of the first magnetic structural piece and the first section of the third magnetic structural piece are connected to each other and the second section of the first magnetic structural piece and the second section of the third magnetic structural piece are connected to each other,
wherein the fourth magnetic structural piece is stacked on the second magnetic structural piece in the third direction such that the first section of the second magnetic structural piece and the first section of the fourth magnetic structural piece are connected to each other and the second section of the second magnetic structural piece and the second section of the fourth magnetic structural piece are connected to each other,
wherein the first coil is wound around the third section of the first magnetic structural piece,
wherein the second coil is wound around the third section of the second magnetic structural piece,
wherein the third coil is wound around the third section of the third magnetic structural piece, and
wherein the fourth coil is wound around the third section of the fourth magnetic structural piece.

19. The magnetic sensor as claimed in claim 18,
wherein the first and third coils are connected in series, and
wherein the second and fourth coils are connected in series.

20. The magnetic sensor as claimed in claim 19, wherein the first and third coils are connected in parallel with the second and fourth coils.

* * * * *